(12) United States Patent
Wang et al.

(10) Patent No.: US 8,432,247 B2
(45) Date of Patent: Apr. 30, 2013

(54) OVER-CURRENT PROTECTION DEVICE

(75) Inventors: David Shau Chew Wang, Taipei (TW);
Chun Teng Tseng, Sanwan Township, Miaoli County (TW)

(73) Assignee: Polytronics Technology Corp., Hsinchu (TW)

( * ) Notice: Subject to any disclaimer, the term of this patent is extended or adjusted under 35 U.S.C. 154(b) by 71 days.

(21) Appl. No.: 13/236,256

(22) Filed: Sep. 19, 2011

(65) Prior Publication Data
US 2012/0075762 A1   Mar. 29, 2012

(30) Foreign Application Priority Data

Sep. 29, 2010   (TW) ................................ 99132964 A

(51) Int. Cl.
*H01C 7/10*   (2006.01)

(52) U.S. Cl.
USPC ........................................ 338/22 R; 338/195

(58) Field of Classification Search ................ 338/22 R, 338/195
See application file for complete search history.

(56) References Cited

U.S. PATENT DOCUMENTS

| | | | | |
|---|---|---|---|---|
| 4,212,045 | A * | 7/1980 | Martzloff | 361/127 |
| 4,434,416 | A * | 2/1984 | Schonberger | 338/22 R |
| 6,690,258 | B2 * | 2/2004 | Katsuki et al. | 338/22 R |
| 7,148,785 | B2 * | 12/2006 | Becker et al. | 338/22 R |

\* cited by examiner

*Primary Examiner* — Kyung Lee
(74) *Attorney, Agent, or Firm* — Stites & Harbison PLLC; Juan Carlos A. Marquez, Esq.

(57) ABSTRACT

An over-current protection device includes a first electrode layer, a second electrode layer, and a resistance material disposed between the first and second electrode layers. The first electrode layer includes a first groove pattern formed on and through the first electrode layer. The first groove pattern is configured to separate the first electrode layer into a plurality of connected regions. The second electrode layer includes a second groove pattern formed on and through the second electrode layer. The second groove pattern is configured to separate the second electrode layer into a plurality of connected regions. The first and second groove patterns are further configured to be formed in an interlaced manner that when the first and second electrode layers are overlapped, the first and second groove patterns form a plurality of independent regions, which divide the resistance material into a plurality of electrically isolated and parallel connected units.

16 Claims, 11 Drawing Sheets

OVER-CURRENT PROTECTION DEVICE

BACKGROUND OF THE INVENTION

1. Field of the Invention

The present invention relates to an over-current protection device.

2. Description of the Related Art

Thermistors are used to protect circuits from being damaged by overheating or excessive current flowing through the circuits. A thermistor usually includes two electrodes and a resistance material disposed therebetween. The resistance material has low resistance when it is at room temperature, while when the temperature is raised to critical temperature or excessive current occurs in a circuit, the resistance increases several thousand times, prohibiting over-current to flow through the circuit so as to protect the circuit.

When the temperature is lowered back to room temperature or the over-current condition is no longer present in the circuit, the resistance of the thermistor returns to low resistance, allowing the circuit to operate normally. With such a reusable characteristic, thermistors are replacing fuses and are popularly used in high density electronic circuits.

However, conventional thermistors are not sufficiently sensitive to the variation of an electric field, so they cannot be used in applications, such as the protection of secondary batteries, that require protection devices to be activated at low temperature. Due to the need for protection devices that can be activated at low temperature to protect electronic devices, there is a need to improve upon the conventional thermistors.

SUMMARY OF THE INVENTION

One objective of the present invention is to provide an over-current protection device that can be activated at lower temperature.

Another objective of the present invention is to provide an over-current protection device that is more sensitive the change of electrical fields.

In accordance with the above objectives, the present invention proposes an over-current protection device, which comprises a first electrode layer, a second electrode layer, and a resistance material. The first electrode layer comprises a first groove pattern that is formed through the first electrode layer and configured to divide the first electrode layer into a plurality of connected regions. The second electrode layer comprises a second groove pattern that is formed through the second electrode layer and configured to divide the second electrode layer into a plurality of connected regions. The resistance material has positive or negative temperature coefficient characteristic. The resistance material is disposed between the first and second electrode layers. The first and second first groove patterns are configured to be interlaced such that when the first and second electrode layers are overlapped, the first and second first groove patterns form a plurality of independent regions, which divide the resistance material into a plurality of electrically isolated and parallel connected units.

Another embodiment of the present invention provides an over-current protection device, which comprises a resistance material, a first electrode layer, a first surface mount pad, a second groove, a second electrode layer, a second surface mount pad, and a third groove. The resistance material has positive or negative temperature coefficient characteristic, and includes opposite upper and lower surfaces. The first electrode layer is disposed on the upper surface, and includes a first groove dividing the first electrode layer into two connected regions. The first surface mount pad is formed on the upper surface. The second groove electrically separates the first surface mount pad from the first electrode layer. The second electrode layer is formed on the lower surface, and electrically connects to the first surface mount pad, wherein the first and second electrode layers hold a portion of the resistance material between them. The second surface mount pad is formed on the lower surface and electrically connects to the first electrode layer. The third groove electrically separates the second electrode layer from the second surface mount pad. The first and second surface mount pads are separated from each other in a direction parallel to the upper surface, and one end of the first groove connects to the second groove, while another end of the first groove is located above the third groove.

With dividing the electrode layers of an over-current protection device into a plurality of independent and adjacent regions, the over-current protection device can be constituted by a plurality of parallel connected components. Thus, the sensitivity of the over-current protection device can be improved, and the activating temperature can be lower. As a result, protected components can be more secure and protective.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 12:
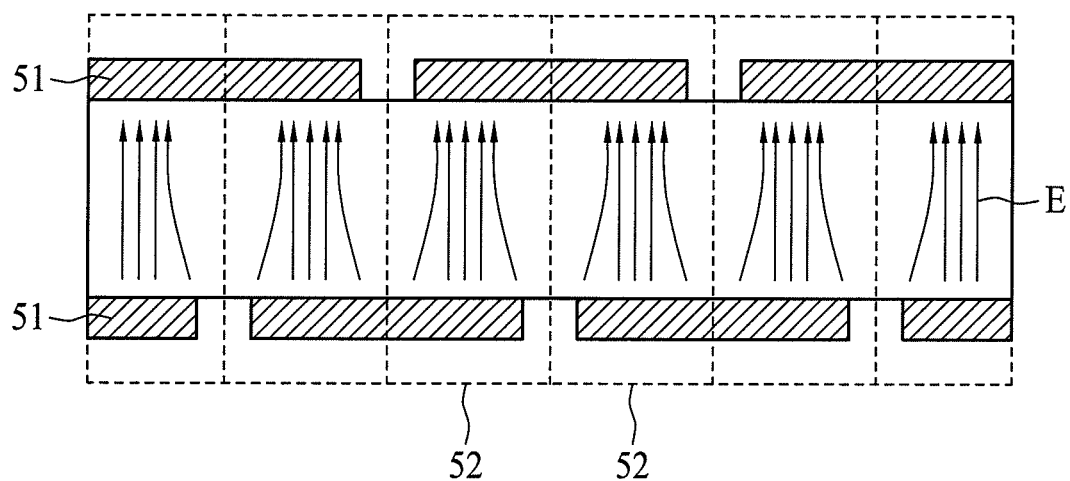
FIG. 12 illustrates electrode components of an over-current protection device according one embodiment of the present invention.

The present invention provides a design of electrode components 51, as shown in FIG. 12, of an over-current protection device. Through the design of electric characteristics and the technique of electrode patterning, electrode components 51 extending parallel to each other are patterned into a plurality of independent and adjoining regions 52 as shown in FIG. 12 so that a single over-current protection device can be divided into a plurality of sub-devices, which are electrically connected in parallel. The adjustment of the dimension of the independent regions 52 and the distance between adjacent independent regions 52 can change the electric fields E of the sub-devices. If the over-current protection device has resistance R, the reciprocal of the resistance R is obtained by adding the reciprocals of the resistances $R_1$ to $R_n$ of the plurality of independent regions 52.

$$\frac{1}{R} = \sum_{i=1}^{n} \frac{1}{R_i},$$

where n is the number of the independent regions 52.

Changing the design of the patterned electrode components 51 of an over-current protection device can adjust the electric fields in the independent regions 52; thus, without changing the compositions of the over-current protection device, the desired current and environmental temperature triggering the over-current protection device can be lowered, resulting in early activation of the over-current protection device.

Figure 1:
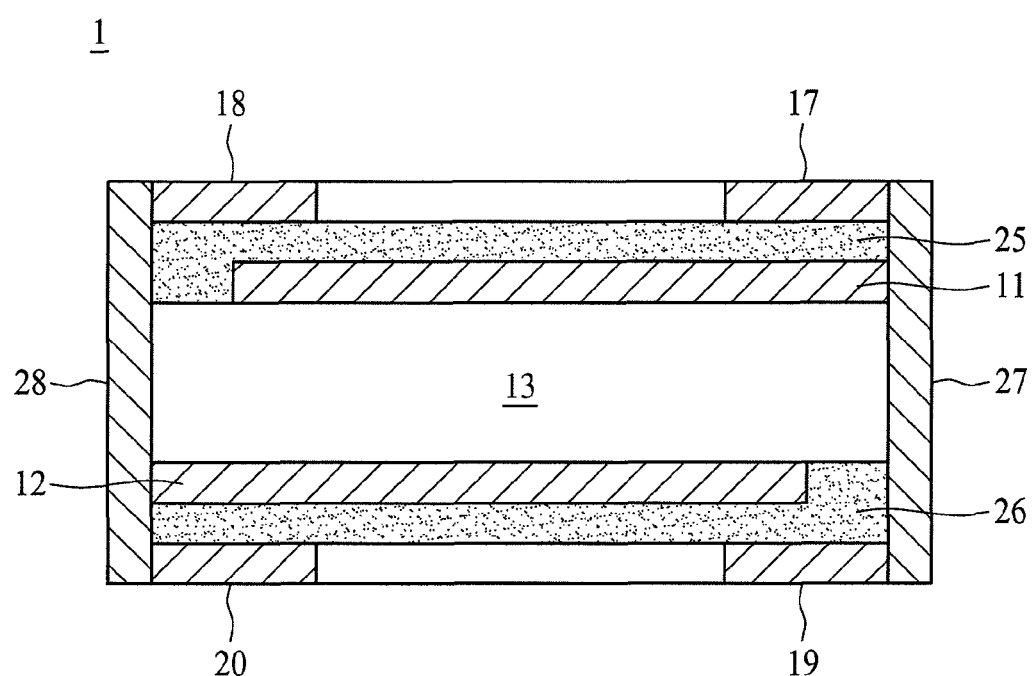
FIG. 1 is a view showing a cross-section of an over-current protection device according to one embodiment of the present invention.
Figure 2A:
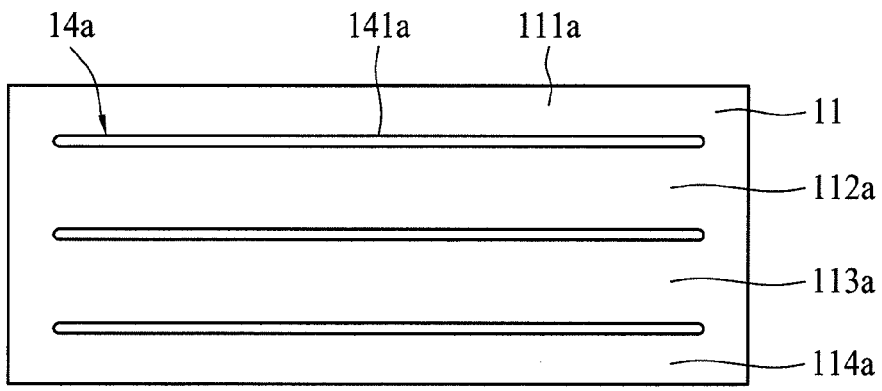
FIG. 2A is a view showing a first groove pattern according to the first embodiment of the present invention.
Figure 2B:
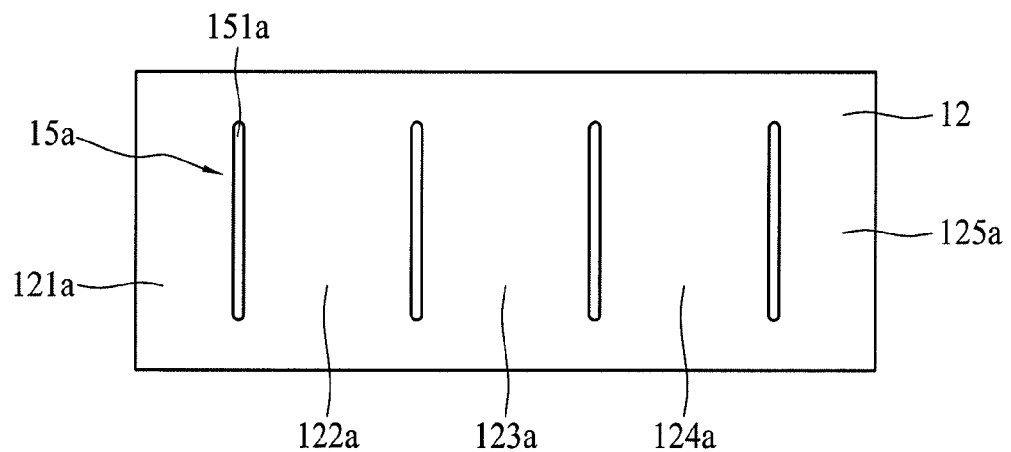
FIG. 2B is a view showing a second groove pattern according to the first embodiment of the present invention.
Figure 2C:
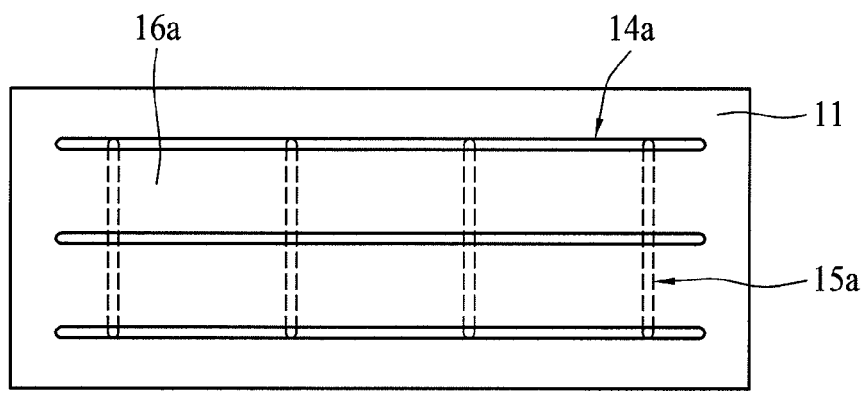
FIG. 2C shows the overlapped first and second groove patterns according to the first embodiment of the present invention.

FIG. 1 is a view showing a cross-section of an over-current protection device 1 according to one embodiment of the present invention. FIG. 2A is a view showing a first groove pattern 14a according to the first embodiment of the present invention. FIG. 2B is a view showing a second groove pattern 15a according to the first embodiment of the present invention. FIG. 2C shows the overlapped first and second groove patterns 14a and 15a according to the first embodiment of the present invention. Referring to FIG. 1, the over-current protection device 1 comprises a first electrode layer 11, a second electrode layer 12, and a resistance material 13, wherein the resistance material 13 is between the first and second electrode layers 11 and 12.

In the present embodiment, the over-current protection device 1 can further comprise a first surface mount pad 17, a second surface mount pad 18, a third surface mount pad 19, a fourth surface mount pad 20, a first insulating film 25, and a second insulating film 26. The first insulating film 25 covers the first electrode layer 11, and the first and second surface mount pads 17 and 18 are on the first insulating film 25, separated from each other, wherein the first surface mount pad 17 is configured to electrically connect with the first electrode layer 11, and the second surface mount pad 18 is configured to electrically connect with the second electrode layer 12. The first and second surface mount pads 17 and 18 allow the over-current protection device 1 to be surface-mounted on a circuit, and the first and second electrode layers 11 and 12 electrically connect with the circuit. In addition, the second insulating film 26 covers the second electrode layer 12, and the third and fourth surface mount pads 19 and 20 are on the second insulating film 26, separated from each other, wherein the third surface mount pad 19 electrically connects with the first electrode layer 11, and the fourth surface mount pad 20 electrically connects with the second electrode layer 12. The third and fourth surface mount pads 19 and 20 allow the over-current protection device 1 to be surface-mounted on a circuit, and the first and second electrode layers 11 and 12 electrically connect with the circuit.

Specifically, the over-current protection device 1 can further comprise two side conductive layers 27 and 28, which are formed on two opposite sides of the over-current protection device 1, wherein an end of the first surface mount pad 17, an end of the first electrode layer 11, and an end of the third surface mount pad 19 connect with the side conductive layer 27 so that the first surface mount pad 17 and the first electrode layer 11 electrically connect with each other, and the third surface mount pad 19 and the first electrode layer 11 electrically connect with each other. Moreover, an end of the second surface mount pad 18, an end of the second electrode layer 12, and end of the fourth surface mount pad 20 connect with the side conductive layer 28 so that the second surface mount pad 18 and the second electrode layer 12 electrically connect with each other, and the fourth surface mount pad 20 and the second electrode layer 12 electrically connect with each other.

In the present embodiment, the resistance material has positive or negative temperature coefficient characteristic, and may comprise a polymer and a plurality of particles in the polymer. The polymer may comprise polyethylene, polypropylene, poly(vinyl fluoride), a mixture thereof, or a copolymer thereof. The particles may be electrically conductive particles such as metal particles. The particles may comprise metal oxide particles, carbon-containing particles, or metal carbide particles.

In addition, the first electrode layer 11 may comprise nickel, copper, zinc, silver, gold, or an alloy thereof. The second electrode layer 12 may comprise nickel, copper, zinc, silver, gold, or an alloy thereof.

Referring to FIGS. 1, 2A and 2C, the first electrode layer 11 comprises a first groove pattern 14a that are formed through the first electrode layer 11. The first groove pattern 14a can be configured as such that regions 111a, 112a, 113a and 114a divided by the first groove pattern 14a are connected; thus, when the first groove pattern 14a is formed, the first electrode layer 11 will not be damaged. In other words, the first groove pattern 14a has no isolated regions, and the first groove pattern 14a and the edges of the first electrode layer 11 form in combination no isolated regions. The isolated region means the portions of the electrode layer 11 that do not electrically connect with the rest of the electrode layer 11.

Further, the second electrode layer 12 comprises a second groove pattern 15a that are formed through the second electrode layer 12. Similarly, the second groove pattern 15a can be configured such that regions 121a, 122a, 123a, 124a and 125a divided by the second groove pattern 15a are connected.

Referring to FIG. 2C, the first and second groove patterns 14a and 15a are configured to be interlaced and matched up with each other such that when the first and second electrode layer 11 and 12 are overlapped, the first and second groove patterns 14a and 15a form in common at least one independent region 16a. In fact, the first and second groove patterns 14a and 15a are separated so that the at least one independent region 16a is not really electrically isolated from the other portions. However, the resistance material in the range of the independent region 16a is isolated from the portion of the resistance material, being in electrical parallel connection with the other portion of the resistance material. Consequently, the sensitivity of the over-current protection device 1 to the change of an electrical field can be increased, and the over-current protection device 1 can be triggered at lower temperature.

In the present embodiment, the first groove pattern 14a may comprise a plurality of grooves 141a, which are placed at regular intervals and extend relative to each other. The second groove pattern 15a may comprise a plurality of grooves 151a, which are placed at regular intervals and extend relative to each other. The plurality of grooves 141a of the first groove pattern 14a and the plurality of grooves 151a of the second groove pattern 15a are interlaced such that when the first groove pattern 14a and the second groove pattern 15a are overlapped, the first groove pattern 14a and the second groove pattern 15a form a meshed structure, wherein each mesh is an independent region 16a.

The resistance material 13 in the range of each independent region 16a operates independently from the resistance material 13 in the ranges of other independent regions 16a when the over-current protection device 1 is triggered. As such, the first and second groove patterns 14a and 15a divide the over-current protection device 1 into a plurality of sub-over-current protection devices so that the over-current protection device 1 can be triggered at low temperature and be more sensitive to the change of electrical field.

In one embodiment, the independent regions 16a can have substantially the same or different area dimensions. In one embodiment, the grooves 141a and the grooves 151a can be interlaced perpendicularly.

Figure 3A:
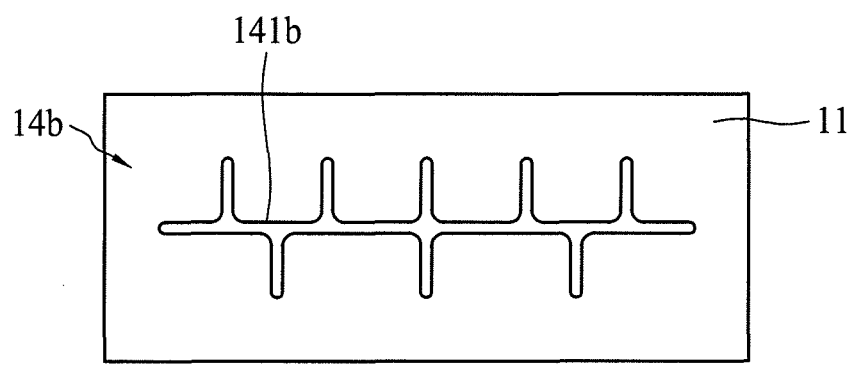
FIG. 3A is a view showing a first groove pattern according to the second embodiment of the present invention.
Figure 3B:
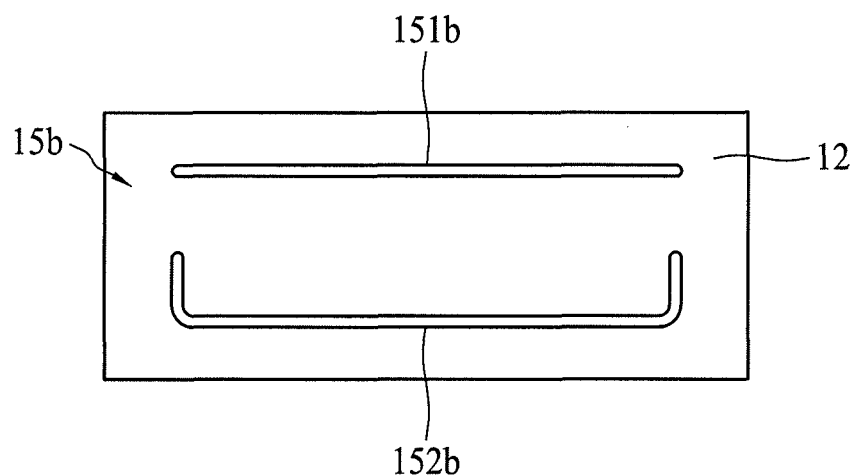
FIG. 3B is a view showing a second groove pattern according to the second embodiment of the present invention.
Figure 3C:
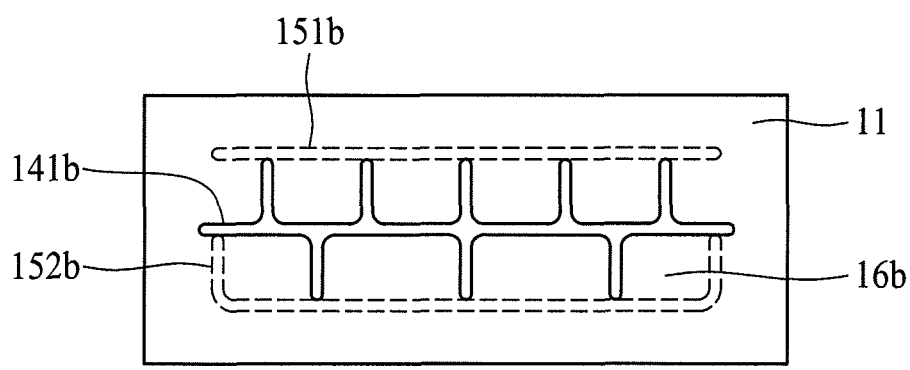
FIG. 3C shows the overlapped first and second groove patterns according to the second embodiment of the present invention.

FIG. 3A is a view showing a first groove pattern 14b according to the second embodiment of the present invention. FIG. 3B is a view showing a second groove pattern 15b according to the second embodiment of the present invention. FIG. 3C shows the overlapped first and second groove patterns 14b and 15b according to the second embodiment of the present invention. Referring to FIGS. 3A to 3C, the first groove pattern 14b on the first electrode layer 11 can comprise bifurcate grooves 141b. In the present embodiment, the bifurcate groove 141b comprises a main groove and a plurality of secondary grooves, wherein the plurality of secondary grooves extend transversely from the main groove. The secondary grooves can be perpendicular to the main groove; however, the present invention is not limited to such a configuration.

The second groove pattern 15b matches the bifurcate groove 141b such that half enclosed regions defined by the bifurcate groove 141b can form independent regions 16b. In the present embodiment, the second groove pattern 15b comprises a straight groove 151b and a U-shaped groove 152b, wherein the straight groove 151b cooperates with the secondary grooves at the upper portion of the bifurcate groove 141b, and the U-shaped groove 152b cooperates with the secondary grooves at the lower portion of the bifurcate groove 141b.

Figure 4A:
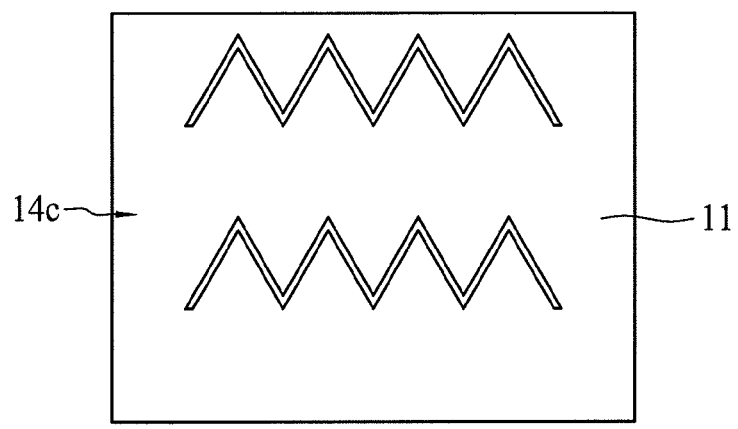
FIG. 4A is a view showing a first groove pattern according to the third embodiment of the present invention.
Figure 4B:
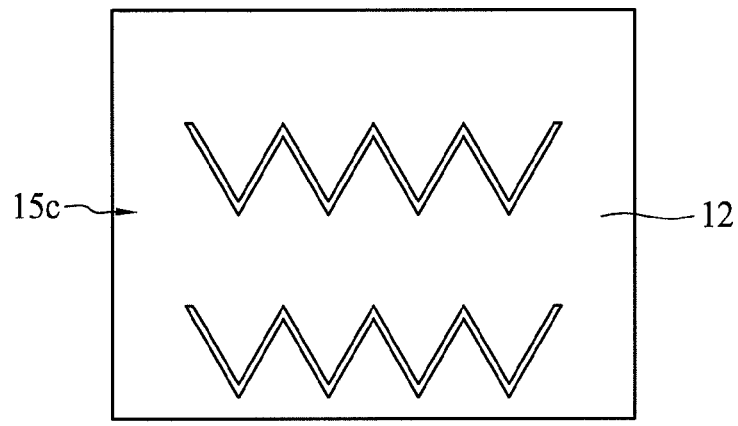
FIG. 4B is a view showing a second groove pattern according to the third embodiment of the present invention.
Figure 4C:
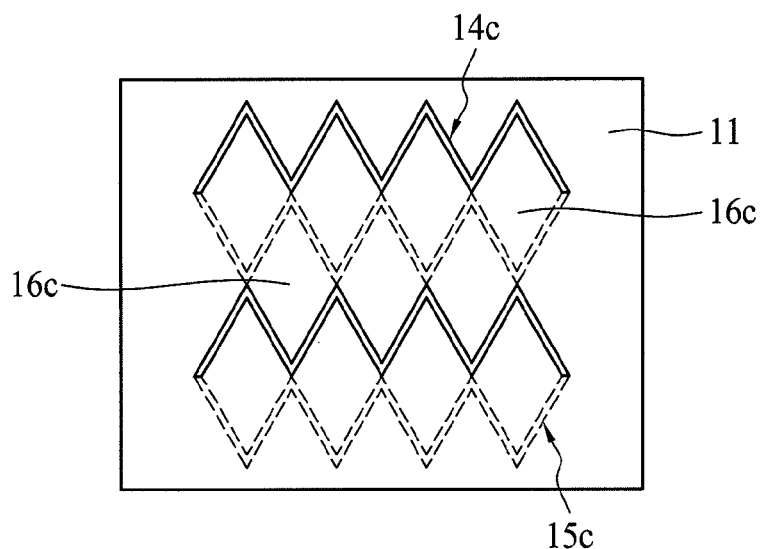
FIG. 4C shows the overlapped first and second groove patterns according to the third embodiment of the present invention.

FIG. 4A is a view showing a first groove pattern 14c according to the third embodiment of the present invention. FIG. 4B is a view showing a second groove pattern 15c according to the third embodiment of the present invention. FIG. 4C shows the overlapped first and second groove patterns 14c and 15c according to the third embodiment of the present invention. Referring to FIGS. 4A to 4C, the first groove pattern 14c on the first electrode layer 11 can comprise a first groove of triangular wave shape, and the second groove pattern 15c can be mated with the first groove pattern 14c, comprising a second groove of triangular wave shape. The first groove of triangular wave shape and the second groove of triangular wave shape can be similar, but opposite in phase. The first groove pattern 14c is mated with the second groove patterns 15c such that when the first and second electrode layers 11 and 12 are overlapped and viewed, the first and second groove patterns 14c and 15c form a plurality of independent regions 16c arranged like a honeycomb.

Figure 5A:
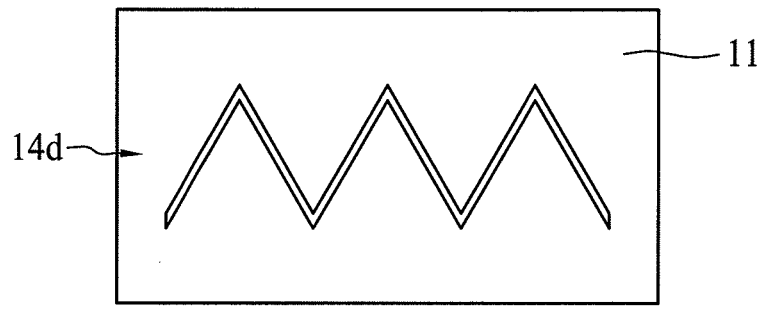
FIG. 5A is a view showing a first groove pattern according to the fourth embodiment of the present invention.
Figure 5B:
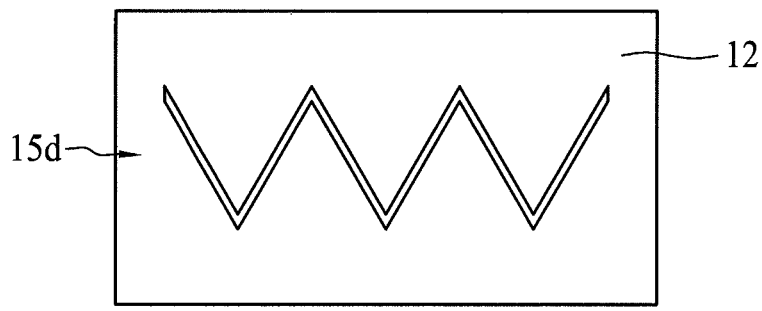
FIG. 5B is a view showing a second groove pattern according to the fourth embodiment of the present invention.
Figure 5C:
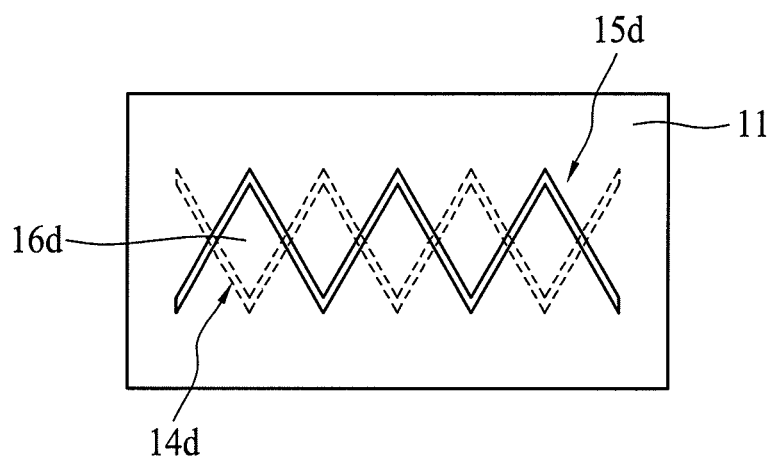
FIG. 5C shows the overlapped first and second groove patterns according to the fourth embodiment of the present invention.

FIG. 5A is a view showing a first groove pattern 14d according to the fourth embodiment of the present invention. FIG. 5B is a view showing a second groove pattern 15d according to the fourth embodiment of the present invention. FIG. 5C shows the overlapped first and second groove patterns 14d and 15d according to the fourth embodiment of the present invention. Referring to FIGS. 5A to 5C, the first groove pattern 14d on the first electrode layer 11 can comprise a first groove of triangular wave shape, and the second groove pattern 15d comprises a second groove of triangular wave shape. The first groove of triangular wave shape and the second groove of triangular wave shape can be similar, but opposite in phase. The first groove pattern 14d is mated with the second groove patterns 15d such that when the first and second electrode layers 11 and 12 are overlapped and viewed, the first and second groove patterns 14d and 15d are overlapped to form a plurality of rhombus-like independent regions 16d.

Figure 6A:
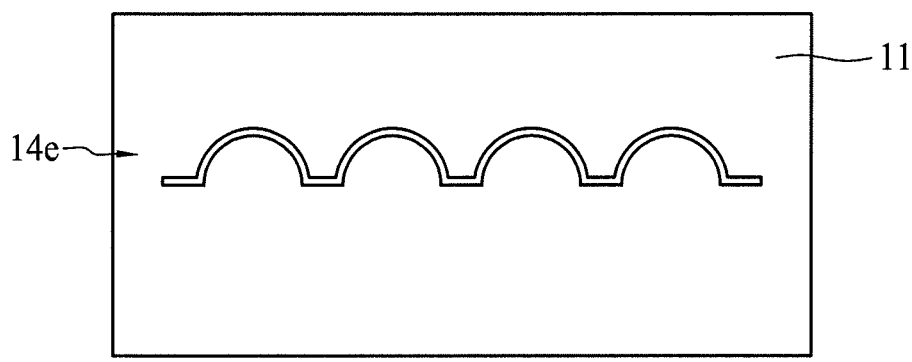
FIG. 6A is a view showing a first groove pattern according to the fifth embodiment of the present invention.
Figure 6B:
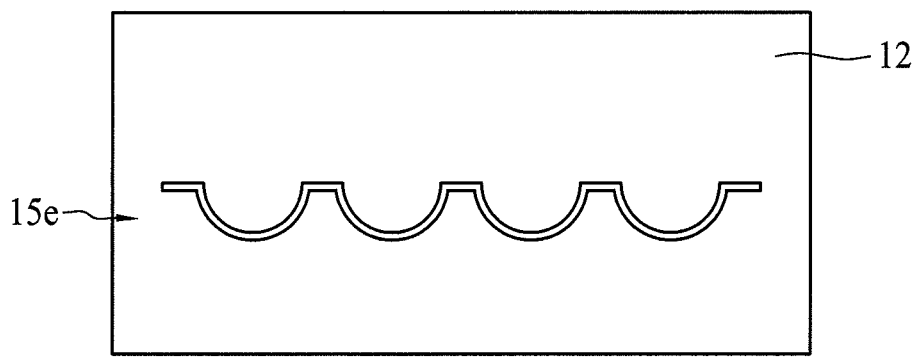
FIG. 6B is a view showing a second groove pattern according to the fifth embodiment of the present invention.
Figure 6C:
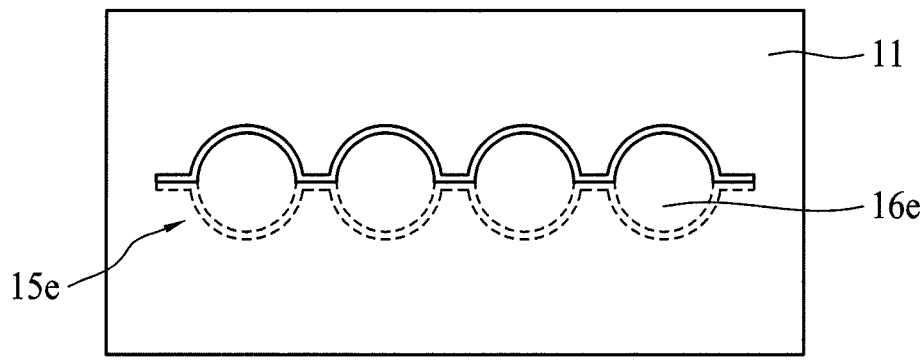
FIG. 6C shows the overlapped first and second groove patterns according to the fifth embodiment of the present invention.

FIG. 6A is a view showing a first groove pattern 14e according to the fifth embodiment of the present invention. FIG. 6B is a view showing a second groove pattern 15e according to the fifth embodiment of the present invention. FIG. 6C shows the overlapped first and second groove patterns 14e and 15e according to the fifth embodiment of the present invention. Referring to FIGS. 6A to 6C, the first groove pattern 14e on the first electrode layer 11 can comprise a first groove of semi-circular shape, and a second groove of semi-circular shape. The first and second grooves of semi-circular shape can be similar but opposite. The first groove pattern 14e is mated with the second groove pattern 15e such that when the first and second electrode layers 11 and 12 are overlapped and viewed, the first and second groove patterns 14e and 15e form a plurality of arrayed independent circular regions 16e.

Figure 7A:
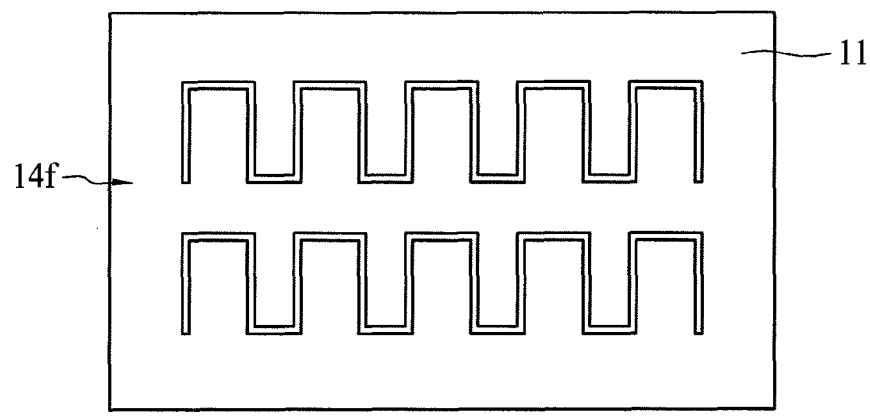
FIG. 7A is a view showing a first groove pattern according to the sixth embodiment of the present invention.
Figure 7B:
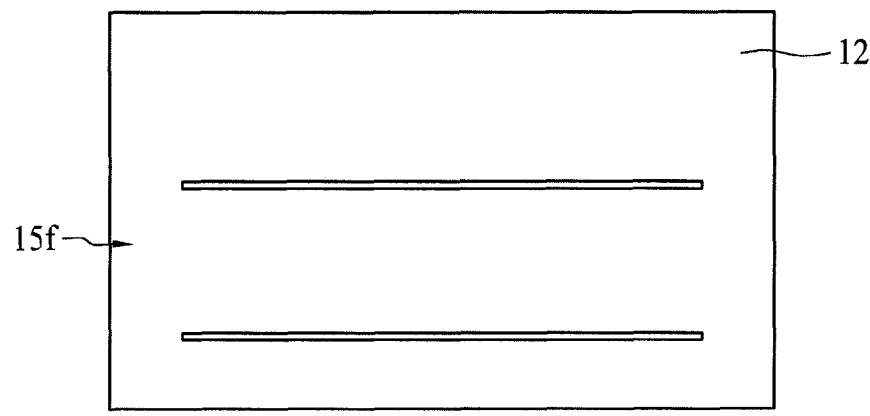
FIG. 7B is a view showing a second groove pattern according to the sixth embodiment of the present invention.
Figure 7C:
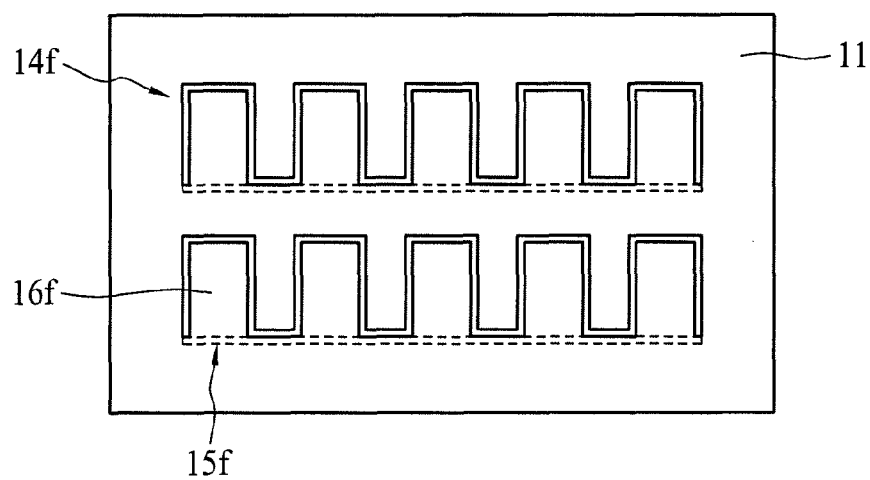
FIG. 7C shows the overlapped first and second groove patterns according to the sixth embodiment of the present invention.

FIG. 7A is a view showing a first groove pattern 14f according to the sixth embodiment of the present invention. FIG. 7B is a view showing a second groove pattern 15f according to the sixth embodiment of the present invention. FIG. 7C shows the overlapped first and second groove patterns 14f and 15f according to the sixth embodiment of the present invention.

Referring to FIGS. 7A to 7C, the first groove pattern 14f on the first electrode layer 11 can comprise a plurality of grooves of rectangular wave shape, and the second groove pattern 15f comprises a plurality of straight lines. Each straight line is configured to mate with the crests of the corresponding grooves of rectangular wave shape or the troughs such that when the first and second electrode layers 11 and 12 are overlapped and viewed, the first groove pattern 14f and the second groove pattern 15f form in common a plurality of independent regions 16f. In another embodiment, the first groove pattern 14f may comprise a first groove of square wave, and the second groove pattern 15f may comprise a second groove of square wave, wherein the first groove of square wave and the second groove of square wave can be similar but opposite. The first groove of square wave and the second groove of square wave are configured as such that when first and second electrode layers 11 and 12 are overlapped and viewed, the corresponding square waves of the first and second grooves of square wave can form a plurality of independent regions; or each square wave of the first and second grooves of square wave individually forms an independent region.

Figure 8A:
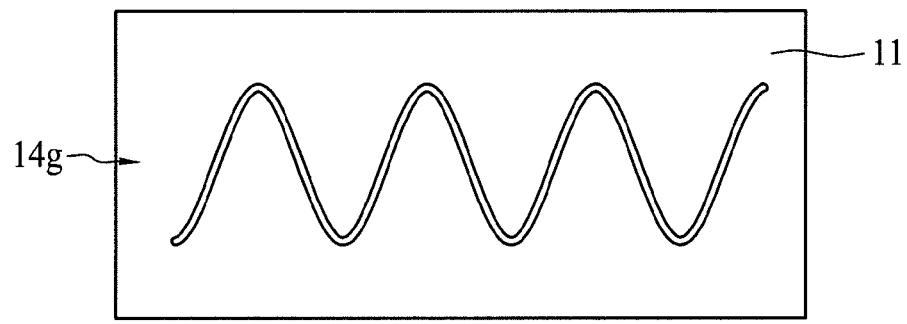
FIG. 8A is a view showing a first groove pattern according to the seventh embodiment of the present invention.
Figure 8B:
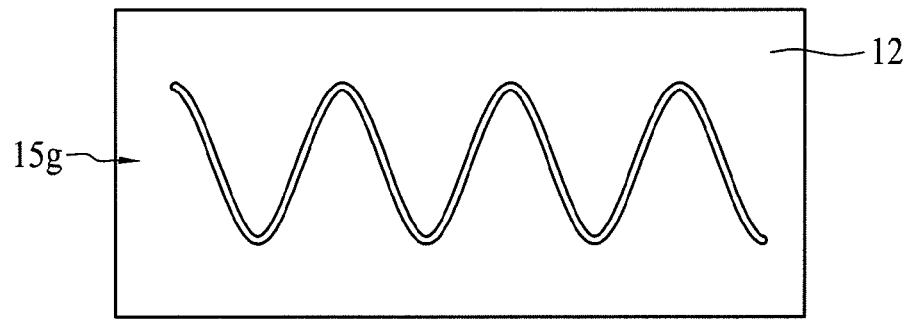
FIG. 8B is a view showing a second groove pattern according to the seventh embodiment of the present invention.
Figure 8C:
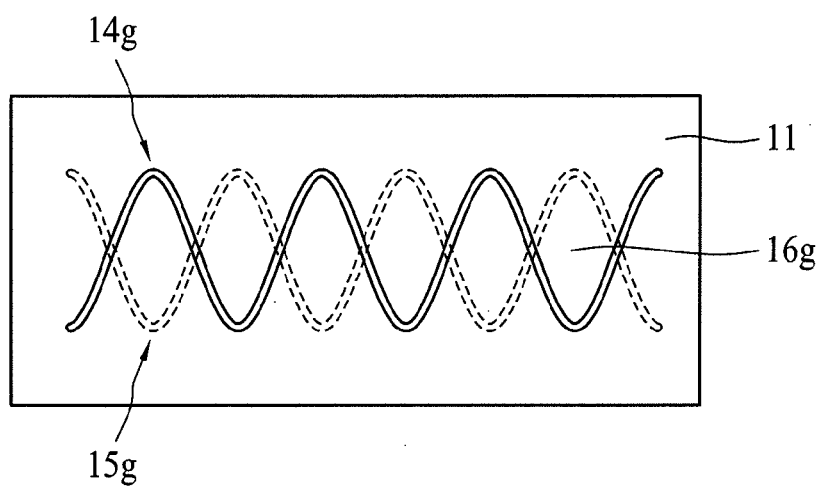
FIG. 8C shows the overlapped first and second groove patterns according to the seventh embodiment of the present invention.

FIG. 8A is a view showing a first groove pattern 14g according to the seventh embodiment of the present invention. FIG. 8B is a view showing a second groove pattern 15g according to the seventh embodiment of the present invention. FIG. 8C shows the overlapped first and second groove patterns 14g and 15g according to the seventh embodiment of the present invention. Referring to FIGS. 8A to 8C, the first groove pattern 14g on the first electrode layer 11 can comprise at least one first curved wave groove, and the second groove pattern 15g comprise at least one second curved wave groove, wherein the at least one first curved wave groove and the at least one second curved wave groove can be similar but opposite in phase, and both can be configured in an interlaced manner. As such, when the first and second electrode layers 11 and 12 are overlapped and viewed, the first groove pattern 14g and the second groove pattern 15g can form in common a plurality of independent regions 16g. In one embodiment, the first and second curved wave grooves can comprise at least one S-shaped groove.

EXAMPLES

The comparative example is formed using prior art technology, wherein the electrode layers of the comparative example has no groove. If the first and second electrode layers are overlapped and viewed, only a single independent region is formed.

TABLE 1

| Item | Groove pattern | Groove width (μm) | Groove area ratio | Initial resistance (ohm) | Activating temperature (□C.) |
|---|---|---|---|---|---|
| Example 1 | S shape | 20.3 | 11% | 7.7 | 85.8 |
| Example 2 | U shape | 76.2 | 22% | 9.4 | 81.1 |
| Example 3 | S shape | 101.6 | 52% | 11.5 | 72.7 |
| Example 4 | bar shape | 127 | 36% | 9.5 | 80.6 |
| Example 5 | bar shape | 300 | 25% | 9.2 | 81.4 |
| Example 6 | bar shape | 20.3 | 7% | 7.4 | 86.7 |
| Example 7 | S shape | 101.6 | 43% | 9.4 | 79.4 |
| Comparative Example 1 | — | — | 0% | 6.3 | 87.9 |

From the experiment results in Table 1, forming groove patterns on the electrode layers 11 and 12 of an over-current protection device 1 can divide the over-current protection device 1 into a plurality of sub-over-current protection devices, consequently reducing the activating temperature of the over-current protection device 1.

Figure 9:
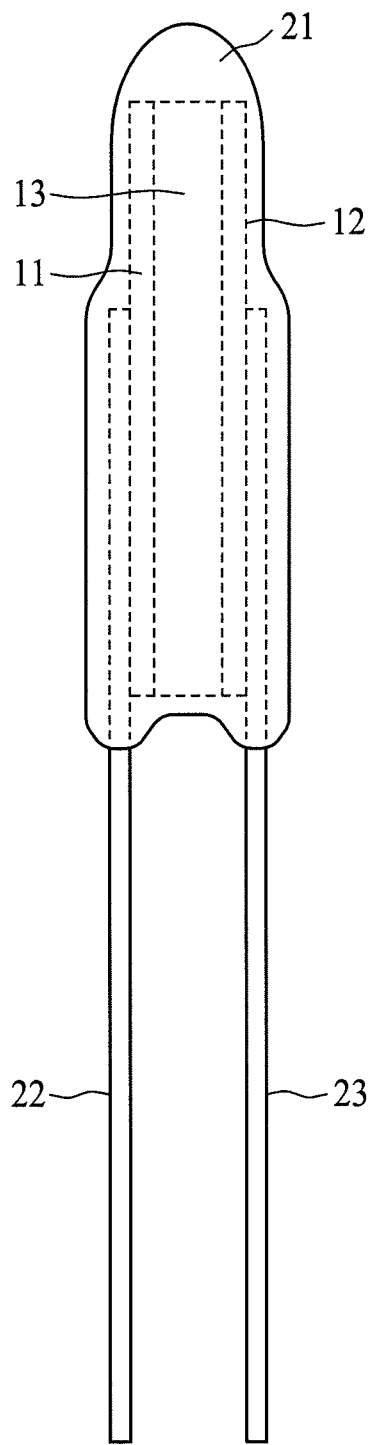
FIG. 9 is a view showing an over-current protection device according to one embodiment of the present invention.

FIG. 9 is a view showing an over-current protection device 2 according to one embodiment of the present invention. Referring to FIG. 9, the over-current protection device 2 comprises a first electrode layer 11, a second electrode layer 12, a resistance material 13, an encapsulating material 21, a first terminal portion 22, and a second terminal portion 23. The resistance material 13 is disposed between the first and second electrode layers 11 and 12. The encapsulating material 21 is configured to cover the first electrode layer 11, the second electrode layer 12, and the resistance material 13. The first terminal portion 22 is configured to electrically connect to the first electrode layer 11, protrude from the encapsulating material 21, and electrically connect to a contact of a circuit. The second terminal portion 23 is configured to electrically connect to the second electrode layer 12, protrude from the encapsulating material 21, and electrically connect to a contact of the circuit.

Figure 10:
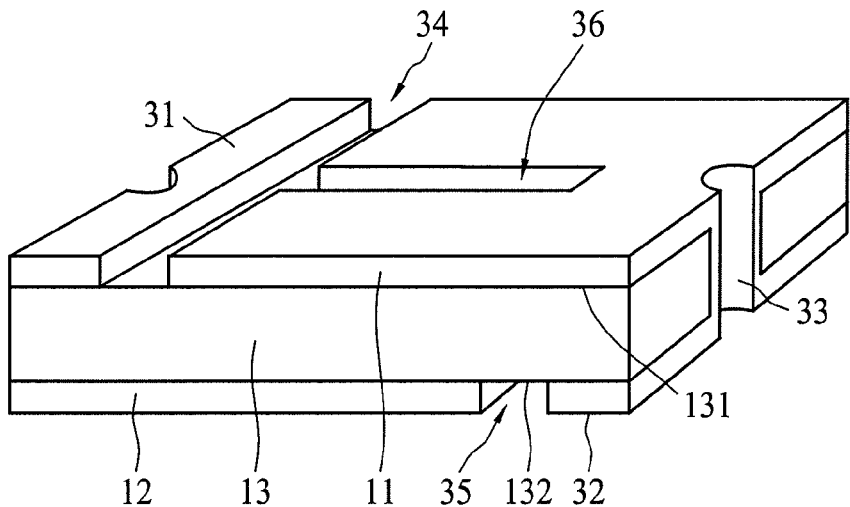
FIG. 10 is a perspective view showing an over-current protection device according to one embodiment of the present invention.
Figure 11:
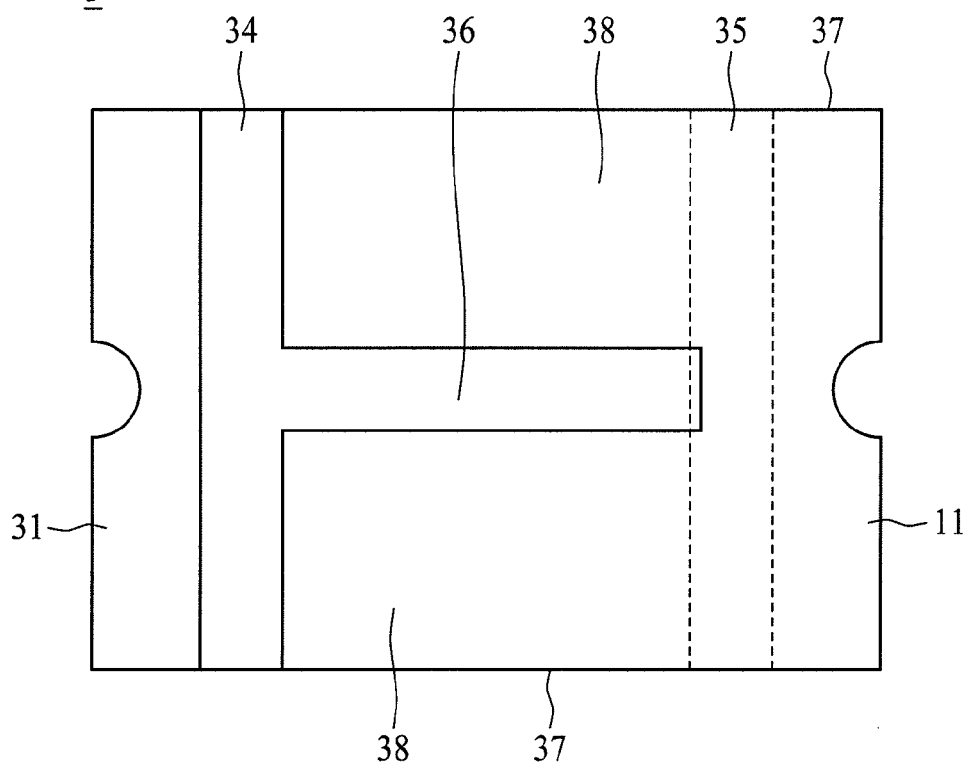
FIG. 11 is a top view showing the over-current protection device of FIG. 10.

FIG. 10 is a perspective view showing an over-current protection device 3 according to one embodiment of the present invention. FIG. 11 is a top view showing the over-current protection device 3 of FIG. 10. Referring to FIGS. 10 and 11, the over-current protection device 3 of the present embodiment comprises a first electrode layer 11, a second electrode layer 12, a resistance material 13, a first surface mount pad 31, and a second surface mount pad 32. The resistance material 13 has positive or negative temperature coefficient characteristic, and comprises opposite upper and lower surfaces 131 and 132. The first electrode layer 11 is disposed on the upper surface 131 of the resistance material 13, comprising a first groove 36, wherein the first groove 36 is configured to divide the first electrode layer 11 into two connected regions. The first surface mount pad 31 is disposed on the upper surface 131 of the resistance material 13, electrically separated by a second groove 34 from the first electrode layer 11. The second electrode layer 12 is disposed on the lower surface 132 of the resistance material 13, electrically connecting to the first surface mount pad 31. The first and second electrode layers 11 and 12 are configured to be partially overlapped, and a portion of the resistance material 13 is formed between the first and second electrode layers 11 and 12. Further, the second surface mount pad 32 is formed on the lower surface 132 of the resistance material 13, electrically connecting to the first electrode layer 11, wherein the second surface mount pad 32 and the second electrode layer 12 are electrically separated by a third groove 35. In the present embodiment, the first and second surface mount pads 31 and 32 are arranged to be separated in a direction parallel to the upper surface 131, and one end of the first groove 36 connects to the second groove 34, and another end of the first groove 36 extends above the third groove 35. As such, the first groove 36, the second groove 34, the third groove 35, and two opposite sides of the over-current protection device 3 form two independent regions 38, and the resistance material 13 between the first and second electrode layers 11 and 12 are divided into two portions connected in parallel. Consequently, the over-current protection device 3 can be activated at lower temperature and is more sensitive to the change of electrical field in the over-current protection device 3.

In the present embodiment, notches can be formed on opposite sides of the over-current protection device 3. Electrical layers 33 are formed in the notches, electrically connecting the first electrode layer 11 and the second surface mount pad 32, and the first surface mount pad 31 and the second electrode layer 12.

In one embodiment, the first groove pattern in the above embodiments can be in an area ratio of from 5% to 50%. The second groove pattern in the above embodiments can be in an area ratio of from 5% to 50%.

In one embodiment, the first groove pattern in the above embodiments can be in an area ratio of from 5% to 30%. The second groove pattern in the above embodiments can be in an area ratio of from 5% to 30%.

In one embodiment, the first and second groove patterns can be formed using an etch process, a laser cutting process, or a mechanical cutting process.

In one embodiment, the first groove pattern in the above embodiments can have a groove width of from 20 micrometers to 300 micrometers. The second groove pattern in the above embodiments can have a groove width of from 20 micrometers to 300 micrometers.

In one embodiment, the first groove pattern in the above embodiments can have a groove width of from 20 micrometers to 125 micrometers. The second groove pattern in the above embodiments can have a groove width of from 20 micrometers to 125 micrometers.

In one embodiment, the above over-current protection devices 1 to 3 can be activated at a temperature of from 70 to 100 degrees Celsius.

In one embodiment, the above over-current protection devices 1 to 3 can be activated at a temperature of from 50 to 80 degrees Celsius.

In summary, a mutually interlaced groove pattern that forms a plurality of independent regions are formed on two opposite disposed electrode layers of an over-current protection device, thereby dividing the resistance material between the two electrode layers into a plurality of units. Consequently, the over-current protection device can be activated at lower temperature, and is more sensitive to the change of electrical field.

The above-described embodiments of the present invention are intended to be illustrative only. Numerous alternative embodiments may be devised by persons skilled in the art without departing from the scope of the following claims.

What is claimed is:

1. An over-current protection device, comprising:
    a first electrode layer comprising a first groove pattern that is formed through the first electrode layer and configured to divide the first electrode layer into a plurality of connected regions;
    a second electrode layer comprising a second groove pattern that is formed through the second electrode layer and configured to divide the second electrode layer into a plurality of connected regions; and
    a resistance material having positive or negative temperature coefficient characteristic, and being disposed between the first and second electrode layers;
    wherein the first and second first groove patterns are configured to be interlaced; when the first and second electrode layers are overlapped, the first and second groove patterns form a plurality of independent regions and divide the resistance material into a plurality of electrically isolated and parallel connected units.

2. The over-current protection device of claim 1, wherein the first groove pattern is in an area ratio of from 5% to 50% of the first electrode layer, and the second groove pattern is in an area ratio of from 5% to 50% of the second electrode layer.

3. The over-current protection device of claim 1, wherein the first groove pattern is in an area ratio of from 5% to 30% of the first electrode layer, and the second groove pattern is in an area ratio of from 5% to 30% of the second electrode layer.

4. The over-current protection device of claim 1, wherein the first and second groove patterns have a groove width of from 20 micrometers to 300 micrometers.

5. The over-current protection device of claim 1, wherein the first and second groove patterns have a groove width of from 20 micrometers to 125 micrometers.

6. The over-current protection device of claim 1, wherein the first groove pattern comprises an S-shaped groove, a groove of triangular wave shape, a groove of rectangular wave shape, a groove of semi-circular shape, or a bifurcate groove.

7. The over-current protection device of claim 1, wherein the over-current protection device has an activating temperature of from 70 to 100 degrees Celsius.

8. The over-current protection device of claim 1, wherein the over-current protection device has an activating temperature of from 50 to 80 degrees Celsius.

9. The over-current protection device of claim 1, wherein the resistance material comprises polyethylene, polypropylene, poly(vinyl fluoride), a mixture thereof, or a copolymer thereof.

10. The over-current protection device of claim 1, wherein the resistance material comprises metal particles, carbon-containing particles, metal oxide particles, or metal carbide particles.

11. The over-current protection device of claim 1, wherein at least one of the first and second electrode layers comprises nickel, copper, zinc, silver, gold, or an alloy thereof.

12. The over-current protection device of claim 1, wherein the first groove pattern comprises a plurality of first grooves placed at regular intervals, and the second groove pattern comprises a plurality of second grooves placed at regular intervals, wherein the first grooves and the second grooves are configured to be interlaced to form a meshed structure.

13. The over-current protection device of claim 12, wherein the first grooves and the second grooves are mutually perpendicular.

14. The over-current protection device of claim 1, further comprising:
    a first surface mount pad electrically connected to the first electrode layer; and
    a second surface mount pad electrically connected to the second electrode layer.

15. The over-current protection device of claim 14, further comprising an insulating film configured to insulate the first and second surface mount pads from the first electrode layer, or insulate the first and second surface mount pads from the second electrode layer.

16. The over-current protection device of claim 1, further comprising:
    an encapsulating material covering the first electrode layer, the second electrode layer, and the resistance material;
    a first terminal portion electrically connecting to the first electrode layer, protruding from the encapsulating material, and being configured to connect to a first contact of a circuit; and
    a second terminal portion electrically connecting to the second electrode layer, protruding from the encapsulating material, and being configured to connect to a second contact of the circuit.

* * * * *